(12) United States Patent
Jiang et al.

(10) Patent No.: US 12,557,713 B2
(45) Date of Patent: Feb. 17, 2026

(54) INTELLIGENT POWER MODULE AND MANUFACTURING METHOD THEREOF

(71) Applicants: EDGELESS SEMICONDUCTOR CO., LTD. OF ZHUHAI, Zhuhai (CN); GREE ELECTRIC APPLIANCES, INC. OF ZHUHAI, Zhuhai (CN)

(72) Inventors: Wei Jiang, Zhuhai (CN); Bo Shi, Zhuhai (CN); Dan Zeng, Zhuhai (CN); Jun Cao, Zhuhai (CN); Yongbo Liao, Zhuhai (CN); Ting Xiao, Zhuhai (CN)

(73) Assignees: EDGELESS SEMICONDUCTOR CO., LTD. OF ZHUHAI, Zhuhai (CN); GREE ELECTRIC APPLIANCES, INC. OF ZHUHAI, Zhuhai (CN)

( * ) Notice: Subject to any disclaimer, the term of this patent is extended or adjusted under 35 U.S.C. 154(b) by 291 days.

(21) Appl. No.: 18/255,234

(22) PCT Filed: Oct. 27, 2021

(86) PCT No.: PCT/CN2021/126772
§ 371 (c)(1),
(2) Date: May 31, 2023

(87) PCT Pub. No.: WO2022/179151
PCT Pub. Date: Sep. 1, 2022

(65) Prior Publication Data
US 2024/0006280 A1    Jan. 4, 2024

(30) Foreign Application Priority Data
Feb. 25, 2021 (CN) .......................... 202110212995.8

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4853* (2013.01)

(58) Field of Classification Search
CPC ...................... H01L 2224/32245–3226; H01L 23/49541–49565;
(Continued)

(56) References Cited

U.S. PATENT DOCUMENTS

2005/0121310 A1  6/2005  Yamada et al.
2014/0048918 A1  2/2014  Nagaune
(Continued)

FOREIGN PATENT DOCUMENTS

CN    203733781 U    7/2014
CN    109511279 A    3/2019
(Continued)

OTHER PUBLICATIONS

International Search Report for Corresponding International App. No. PCT/CN2021/126772, mailed Jan. 26, 2022, 2 pages.
(Continued)

*Primary Examiner* — Sonya McCall-Shepard
(74) *Attorney, Agent, or Firm* — Armstrong Teasdale LLP

(57) ABSTRACT

Disclosed are an intelligent power module and a manufacturing method thereof, which relate to the technical field of electronic devices. The intelligent power module includes a substrate, wherein a chip and a plurality of conductive pins are arranged on the substrate, one end of each of the conductive pins is connected to the chip, and a solder pin is formed at an end portion of the other end of the conductive pin; and an external pin frame, including a plurality of leads, (Continued)

and a connection structure is formed at an end portion of one end of each of the lead; and the connection structure includes a connection portion, and support portions, wherein an arrangement direction of the support portions is the same as that of the solder pins, an accommodation space is formed between the two support portions, and the solder pin is located between the two support portions.

19 Claims, 2 Drawing Sheets

(51) Int. Cl.
*H01L 23/373* (2006.01)
*H01L 23/495* (2006.01)

(58) Field of Classification Search
CPC ........ H01L 23/49838–49844; H01L 23/49811; H01L 21/4853; H01L 23/3735; H01L 21/48; H01L 23/495; H01L 23/4952; H01L 21/4825; H01L 23/49524
See application file for complete search history.

(56) References Cited

U.S. PATENT DOCUMENTS

| 2019/0385942 A1 | 12/2019 | Saegusa |
| 2020/0266129 A1 | 8/2020 | Higashi |

FOREIGN PATENT DOCUMENTS

| CN | 215183859 U | 12/2021 |
| WO | 2012096066 A1 | 7/2012 |

OTHER PUBLICATIONS

First Search Report for Chinese Patent Application No. 2021102129958 issued on Nov. 29, 2024, 1 page.

INTELLIGENT POWER MODULE AND MANUFACTURING METHOD THEREOF

CROSS-REFERENCE TO RELATED APPLICATION

The present application is a National Stage Entry of International Application No. PCT/CN2021/126772, filed Oct. 27, 2021, which claims priority to Chinese Patent Application No. 202110212995.8, filed to the Chinese Patent Office on Feb. 25, 2021 and entitled "Intelligent power module and manufacturing method thereof," which are incorporated in their entirety herein by reference.

TECHNICAL FIELD

The present disclosure relates to the technical field of electronic devices, and in particular to an intelligent power module and a manufacturing method thereof.

BACKGROUND

An intelligent power module (IPM) not only integrates a power switching device and a driving circuit, but also includes fault detection circuits for overvoltage, overcurrent and overheating, thereby being convenient to use. The IPM not only reduces a size of a system, but also enhances reliability of the system, thereby winning an increasing share of the market. It is particularly suitable for frequency converters and a wide range of inverter power sources of driving motors, and is able to function as an extremely ideal power electronic device for the technical fields of variable-frequency speed regulators, metallurgical machinery, electric tractors, servo drive, and variable-frequency household appliances.

In order to improve a heat dissipation capability of the IPM, a direct bonding copper (DBC) ceramic substrate will be a trend serving as a chip carrier. A chip is soldered onto the substrate, on which a plurality of pins electrically connected with the chip are arranged. The pins can be electrically connected with other components by an intermediate frame, so as to electrically connect the chip with other components. However, due to a high density of the pins on the substrate, a limited bonding area, and poor reliability of a bonding structure between the intermediate frame and the pins on the substrate, the risk such as a short circuit caused by connection between adjacent pins is highly possible. In view of that, how to reliably bond the intermediate frame and the pins on the substrate is a problem urgently to be solved at present.

SUMMARY

The present disclosure discloses an intelligent power module and a manufacturing method thereof. In the intelligent power module, support portions of connection structures of an external pin frame are able to isolate two adjacent solder pins, such that the risk that bonding materials splash out towards two sides is reduced during reflow soldering, and the bonding materials is able to be prevented from flowing to adjacent solder pins, such that the risk of a short circuit caused by connection of the bonding materials on adjacent solder pins is effectively reduced. The solder pins are covered with the connection structures, and the support portions on the two sides is able to have a limiting effect to some extent, such that the risk of dislocation of solder points during preparation is able to be effectively avoided, and accuracy of connection between the leads and the solder pins is effectively ensured.

In order to achieve the above objective, the present disclosure provides the following technical solution:

an intelligent power module includes:

a substrate, where a chip and a plurality of conductive pins distributed along a peripheral side of the chip at intervals are arranged on the substrate, one end of each of the conductive pins is connected to the chip, and a solder pin is formed at an end portion of the other end of the each of the conductive pins;

an external pin frame, where the external pin frame includes a plurality of leads corresponding to a plurality of solder pins one to one, and a connection structure configured to be connected with a corresponding solder pin is formed at an end portion of one end of each of the leads; and in each set of the connection structure and the solder pin that correspond to each other, the connection structure includes: a connection portion arranged corresponding to a top surface of the solder pin, and support portions located on two sides of the connection portion respectively and extending towards the substrate, where an arrangement direction of the support portions is the same as that of the solder pins, an accommodation space is formed between the two support portions, and the solder pin is located between the two support portions; and bonding materials, where the bonding materials are arranged on top surfaces of the solder pins, and are located between the solder pins and the connection portions, and the solder pins are connected to the connection portions by means of the bonding materials.

The intelligent power module includes the substrate, wherein the chip is soldered onto the substrate, the plurality of conductive pins are arranged on the substrate, the conductive pins are sequentially arranged around the peripheral side of the chip at intervals, adjacent conductive pins are arranged at intervals and insulated from each other, one end of each of the conductive pins is connected with an electrode metal of the chip, so as to electrically connect each of the conductive pins with the chip, and the solder pin is formed at the end portion of the other end of each of the conductive pins, such that the plurality of solder pins are sequentially distributed on the peripheral side of the chip and are arranged in a circumferential direction of the chip at intervals. Specifically, the plurality of solder pins located on the same side of the peripheral side of the chip are able to be orderly and sequentially arranged, and have one arrangement direction. The external pin frame includes the plurality of leads, wherein the leads are conductive leads, and the plurality of leads are correspondingly connected with the plurality of solder pins on the substrate one to one. Specifically, in the leads and the solder pins that correspond to each other, the connection structure connected with the corresponding solder pin is formed at the end portion of one end of each of the leads. Specifically, in each set of the connection structure and the solder pin that correspond to each other, the connection structure includes the connection portion opposite to the top surface of the solder pin facing away from the substrate, wherein two sides of the connection portion are provided with the support portions extending towards a direction of the substrate, the accommodation space is formed between the two support portions on the two sides of the connection portion, the solder pin is able to be located in the accommodation space of the two support portions, and the top surface of the solder pin is opposite to the connection portion. The arrangement direction of the two support portions is the same as that of the solder pins. That is, in the connection structure, two side edges of the connection portion extend towards the direction of the substrate respectively to form the two support portions, a groove structure is formed at the two support potions and the connection portion, and the groove structure has a cross section in an inverted "U" shape. Two side walls are formed at the two support portions respectively, a bottom wall of the groove structure is formed at the connection portion, matching of the connection structure and the solder pin is equivalent to that the connection structure covers the solder pin, the connection portion is opposite to the top surface of the solder pin, and the two support portions are located on two opposite sides of the solder pin respectively. Since the plurality of solder pins are arranged, and the plurality of corresponding leads are arranged, after the plurality of solder pins are correspondingly matched, assembled and connected with the plurality of connection structures one to one, the connection structures cover the solder pins in the arrangement direction of the solder pins, and the support potions of the connection structures are able to isolate two adjacent solder pins between two adjacent solder pins. The connection structures cover the bonding materials on the top surfaces of the solder pins, such that the bonding materials are able to be effectively prevented from splashing out to two sides during reflow soldering, the risk that the bonding materials splash out towards the two sides is reduced, and the bonding materials are able to be prevented from flowing to adjacent solder pins. The bonding materials on adjacent solder pins are able to be prevented from being connected with each other when the bonding materials are excessive, such that the risk of a short circuit caused by connection of the bonding materials on adjacent solder pins is effectively reduced. The solder pins are covered with the connection structures, and the support portions on the two sides are able to have a limiting effect to some extent. During preparation, when the external pin frame is assembled, and not fixed to the substrate, the connection structures of the leads and the solder pins are limited stably, such that the risk of dislocation of solder points caused by factors such as vibration during preparation is able to be effectively reduced, and accuracy of connection between the leads and the solder pins is able to be effectively ensured.

Therefore, in the intelligent power module, the support portions of each of the connection structures of the external pin frame are able to isolate two adjacent solder pins, such that the risk that the bonding materials splash out towards the two sides is reduced during reflow soldering, and the bonding materials are able to be prevented from flowing to adjacent solder pins, such that the risk of a short circuit caused by connection of the bonding materials on adjacent solder pins is effectively reduced. The solder pins are covered with the connection structures, and the support portions on the two sides are able to have a limiting effect to some extent, such that the risk of dislocation of solder points during preparation is able to be effectively reduced, and accuracy of connection between the leads and the solder pins is effectively ensured.

In some embodiments, the two support portions of each of the connection structures have the same size in a direction perpendicular to the substrate.

In some embodiments, in each of the connection structures, an end of each of the support portions of the connection structure facing to the substrate is in contact connection with the substrate.

In some embodiments, in the each connection structure, a side of the connection portion facing a corresponding solder pin is provided with a boss structure.

In some embodiments, the connection portion and the two support portions are of an integrated structure.

In some embodiments, the substrate is a ceramic substrate.

In some embodiments, the intelligent power module further includes a printed circuit board (PCB), where the other end of each of the leads of the external pin frame is electrically connected with the PCB.

In some embodiments, the bonding materials include solder paste, silver paste or sintered silver.

In some embodiments, a material of the conductive pins includes copper or aluminum.

The present disclosure further provides a manufacturing method for any intelligent power module according to the technical solution described above. The manufacturing method includes:

arranging the bonding material on a top surface of each of solder pins of the substrate;

assembling the external pin frame to the substrate by a carrier, where connection structures of leads of the external pin frame correspond to the solder pins one to one, and in the each set of the connection structure and the solder pin that correspond to each other, the connection portion of the connection structure corresponds to a top surface of the solder pin, the bonding material is located between the connection portion and the solder pin, the two support portions of the connection structure are located on two sides of the solder pin respectively, and an arrangement direction of the two support portions is the same as that of the solder pins; and carrying out reflow soldering on the bonding materials to solder the connection portions to the solder pins.

Figure 1:
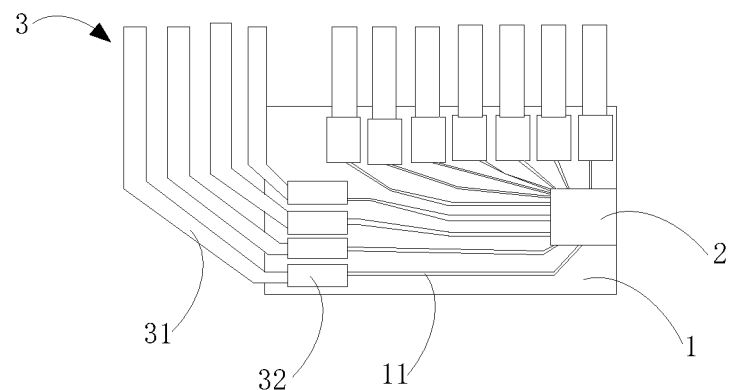
FIG. 1 is a partial schematic structural diagram of connection and fit of a substrate and an external pin frame of an intelligent power module according to an example of the present disclosure.

Reference numerals: 1—substrate; 2—chip; 3—external pin frame; 4—bonding material; 11—conductive pin; 31—lead; 32—connection structure; 111—solder pin; 321—connection portion; 322—support portion; and 3211—boss structure.

DETAILED DESCRIPTION OF THE EMBODIMENTS

The technical solutions in embodiments of the present disclosure are clearly and completely described below in combination with the accompanying drawings in the embodiments of the present disclosure. Apparently, the embodiments described are only some embodiments rather than all embodiments of the present disclosure. On the basis of the embodiments in the present disclosure, all other embodiments derived by those of ordinary skill in the art without making creative efforts fall within the scope of protection of the present disclosure.

Figure 2:
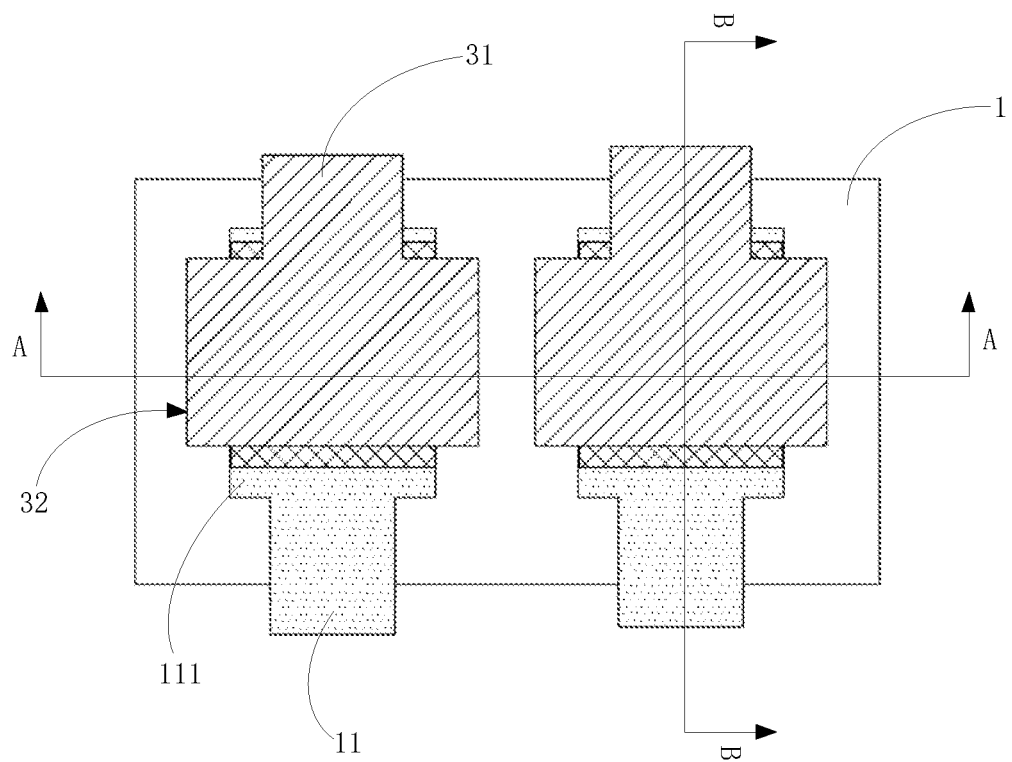
FIG. 2 is a schematic top view of fit and connection of a connection structure and a solder pin according to an example of the present disclosure.
Figure 3:
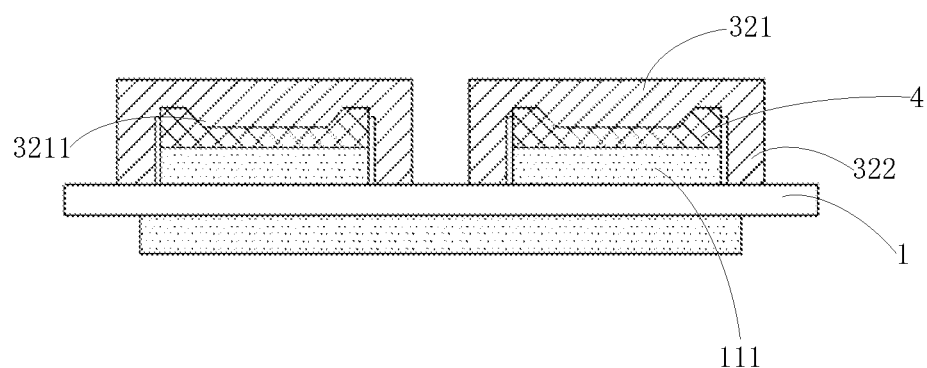
FIG. 3 is a schematic diagram of a sectional structure in an A-A direction in FIG. 2.

As shown in FIGS. 1, 2 and 3, an embodiment of the present disclosure provides an intelligent power module. The intelligent power module includes: a substrate 1, wherein a chip 2 and a plurality of conductive pins 11 distributed along a peripheral side of the chip 2 at intervals are arranged on the substrate 1, one end of each of the conductive pins 11 is connected with the chip 2, and a solder pin 111 is formed at an end portion of the other end of the conductive pin; and an external pin frame 3, wherein the external pin frame 3 includes a plurality of leads 31 corresponding to the plurality of solder pins 111 one to one, and a connection structure 32 configured to be connected with a corresponding solder pin 111 in the solder pins is formed at an end portion of one end of each of the leads 31; and in each set of the connection structure 32 and the solder pin 111 that correspond to each other, the connection structure 32 includes: a connection portion 321 arranged corresponding to a top surface of the solder pin 111, and support portions 322 located on two sides of the connection portion 321 respectively and extending towards the substrate 1, wherein an arrangement direction of the support portions 322 is the same as that of the solder pins 111, an accommodation space is formed between the two support portions 322, and the solder pin 111 is located between the two support portions 322.

The above intelligent power module includes the substrate 1, wherein the chip 2 is soldered onto the substrate 1. Specifically, the chip is able to be a full-bridge driver chip. The substrate serves as a carrier of the chip, and the chip is connected with the substrate. The plurality of conductive pins 11 are arranged on the substrate 1. Specifically, the conductive pins are able to be metal covered pins, and are sequentially arranged around the peripheral side of the chip 2 at intervals, adjacent conductive pins are arranged at intervals and insulated from each other, one end of each of the conductive pins is connected with an electrode metal of the chip 2, so as to electrically connect each of the conductive pins with the chip 2, and the solder pin 111 is formed at the end portion of the other end of the each of the conductive pins, such that the plurality of solder pins 111 are sequentially distributed on the peripheral side of the chip 2 and are arranged in a circumferential direction of the chip 2 at intervals. Specifically, the plurality of solder pins located on the same side of the peripheral side of the chip 2 are able to be orderly and sequentially arranged, and have one arrangement direction. The external pin frame 3 includes the plurality of leads 31, wherein the plurality of leads 31 are correspondingly connected with the plurality of solder pins 111 on the substrate 1 one to one. Specifically, in the leads 31 and the solder pins 111 that correspond to each other, the connection structure 32 connected with the corresponding solder pin 111 is formed at the end portion of an end of each of the leads 31. Specifically, in each set of the connection structure 32 and the solder pin 111 that correspond to each other, the connection structure 32 includes the connection portion 321 opposite to the top surface of the solder pin 111 facing away from the substrate 1, wherein two sides of the connection portion 321 are provided with support portions 322 extending towards a direction of the substrate 1, the accommodation space is formed between the two support portions 321 on the two sides of the connection portion 321, the solder pin 111 is able to be located in the accommodation space of the two support portions 321, and the top surface of the solder pin 111 is opposite to the connection portion 321. The arrangement direction of the two support portions 321 is the same as that of the solder pins 111. That is, in the connection structure, with reference to FIG. 1 and as shown in FIGS. 2 and 3, two side edges of the connection portion 321 extend towards the direction of the substrate 1 respectively to form the two support portions 322, a groove structure is formed by the two support potions 322 and the connection portion 321, and the groove structure has a cross section in an inverted "U" shape. Two side walls are formed at the two support portions 322 respectively, a bottom wall of the groove structure is formed at the connection portion 321, matching of the connection structure 32 and the solder pin 111 is equivalent to that the connection structure 32 covers the solder pin 111, the connection portion 321 is opposite the top surface of the solder pin 111, and the two support portions 322 are located on two opposite sides of the solder pin 111 respectively. Since the plurality of solder pins 111 are arranged, and the plurality of corresponding leads 31 are arranged, after the plurality of solder pins 111 are correspondingly matched, assembled and connected with the plurality of connection structures 32 one to one, the connection structures 32 cover the solder pins 111 in the arrangement direction of the solder pins 111 respectively, and the support potions 322 of the connection structure 32 are able to isolate two adjacent solder pins 111 between two adjacent solder pins 111. The connection structures 32 cover the bonding materials 4 on the top surfaces of the solder pins, such that the bonding materials 4 are able to be effectively prevented from splashing out to two sides during reflow soldering, and the risk that the bonding materials 4 splash out towards the two sides is reduced. The bonding materials 4 are able to be prevented from flowing to adjacent solder pins 111, and the bonding materials 4 on adjacent solder pins 111 are able to be prevented from being connected with each other when the bonding materials 4 are excessive, such that the risk of a short circuit caused by connection of the bonding materials 4 on adjacent solder pins 111 is effectively reduced. The solder pins 111 are covered with the connection structures 32, and the support portions 322 on the two sides are able to have a limiting effect to some extent. During manufacturing, when the external pin frame 3 is assembled, and not fixed to the substrate 1, the connection structures 32 of the leads 31 and the solder pins 111 are limited stably, such that the risk of dislocation of solder points caused by factors such as vibration during preparation is able to be effectively reduced, and accuracy of connection between the leads 31 and the solder pins 111 is able to be effectively ensured.

Therefore, in the intelligent power module, the support portion 322 of each of the connection structures 32 of the external pin frame 3 is able to isolate two adjacent solder pins 111, such that the risk that the bonding materials 4 splash out towards the two sides is reduced during reflow soldering, and the bonding materials 4 are able to be prevented from flowing to adjacent solder pins 111. Accordingly, the risk of a short circuit caused by connection of the bonding materials 4 on adjacent solder pins 111 is effectively reduced. The solder pins 111 are covered with the connection structures 32, and the support portions 322 on the two sides are able to have a limiting effect to some extent, such that the risk of dislocation of solder points during preparation is able to be effectively reduced, and accuracy of connection between the leads 31 and the solder pins 111 is effectively ensured.

In some embodiments, in the intelligent power module, the two support portions 322 of each of the connection structures 32 have the same size in a direction perpendicular to the substrate 1; and an end of each of the support portions 322 of the connection structure 32 facing to the substrate 1 is in contact connection with the substrate 1. The two support portions 322 have an effect of supporting the connection portion 321, such that it is able to be ensured that the connection portion 321 is parallel to the substrate 1 during the assembly of the external pin frame and the substrate 1, and the risk of glue overflow on a heat dissipation surface of a product after plastic sealing is reduced.

Figure 4:
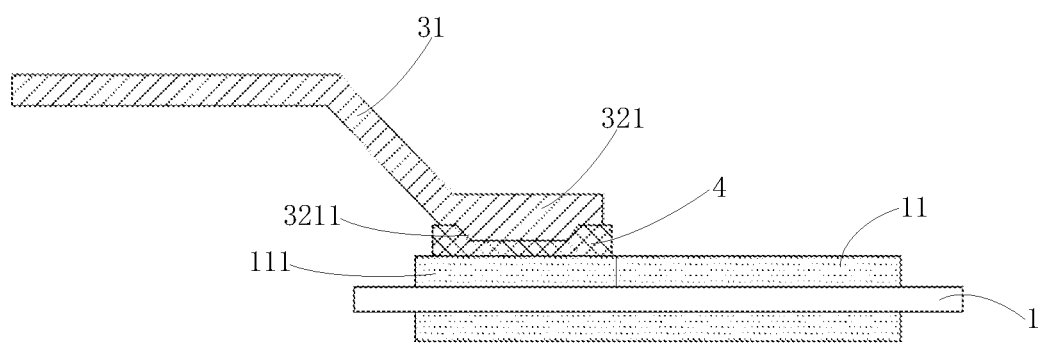
FIG. 4 is a schematic diagram of a sectional structure in a B-B direction in FIG. 2.

In some embodiments, as shown in FIGS. 3 and 4, in the intelligent power module, in the each connection structure, a side of each of the connection portions 321 facing to a corresponding the solder pin 111 is provided with a boss structure 3211. The boss structures are able to prevent poor bonding in a middle when the bonding materials 4 are insufficient since gaps are provided between the connection portions 321 and the solder pins 111 by the support portions 322 to accommodate the bonding materials 4, such that bonding reliability of solder points between the solder pins 111 and the connection portions 321 is improved.

In some embodiments, in the intelligent power module, the connection portion 321 and the two support portions 322 in each of connection structures 32 are connected together to form an integrated structure. The connection portion 321 and the two support portions 322 are of an integrated structure, such that a structure is excellent, and stability is strong.

In an embodiment, in the intelligent power module, the substrate 1 is a ceramic substrate. The ceramic substrate is a copper-clad ceramic substrate, which is able to be a single sided copper-clad ceramic substrate or a double sided copper-clad ceramic substrate. The ceramic substrate has high thermal conductivity, high electrical insulation, low expansion, high conductivity, and excellent weldability. As the carrier of the chip 2, the ceramic substrate saves a complex heat dissipation structure and simplifies an overall structure due to low thermal resistance and excellent heat dissipation of the ceramic substrate.

In an embodiment, in the intelligent power module, the intelligent power module further includes a printed circuit board (PCB), wherein the other end of each of the leads 31 of the external pin frame 3 is electrically connected with the PCB. The chip 2 of the substrate 1 is assembled to the PCB by the external pin frame 3, such that bonding is firm.

In an embodiment, in the intelligent power module, the bonding materials 4 include solder paste, silver paste or sintered silver.

In an embodiment, in the intelligent power module, a material of the conductive pins includes copper or other wire materials, which is not limited in the embodiment.

With reference to FIGS. 1-4, the present disclosure further provides a manufacturing method of any intelligent power module according to the embodiment described above. The manufacturing method includes:

arrange the bonding material 4 on a top surface of each of solder pins 111 of the substrate 1, wherein specifically, the bonding material 4 is able to be solder paste, silver paste or sintered silver, and is able to be arranged on the top surface of the solder pin 111 in a printed manner at a room temperature;

assembly the external pin frame to the substrate 1 by a carrier, wherein connection structures 32 of leads 31 of the external pin frame 3 correspond to the solder pins 111 one to one, and in each set of the connection structure and solder pin that correspond to each other, a connection portion 321 of the connection structure 32 corresponds to a top surface of the corresponding solder pin 111, the bonding material 4 is located between the connection portion 321 and the solder pin 111, two support portions 322 of the connection structure 32 are located on two sides of the solder pin 111 respectively, and an arrangement direction of the two support portions is the same as that of the solder pins; and carry out reflow soldering on the bonding materials 4 to solder the connection portions 321 to the solder pins 111.

The step of carrying out reflow soldering on the bonding materials 4 specifically includes: after the external pin frame is assembled to the substrate 1, treat the bonding materials 4 at a high temperature, wherein the bonding materials 4 are in a liquid state at a high temperature, so as to be connected with the connection portions 321 and the solder pins 111; and then, reduce the temperature to cool the bonding materials, wherein the bonding materials 4 are in a solid state, so as to solder the connection portions 321 to the solder pins 111.

Apparently, those skilled in the art should make various modifications and variations to the embodiments of the present disclosure without departing from the spirit and scope of the present disclosure. In this way, if these modifications and variations of the present disclosure fall within the scope of the claims of the present disclosure and equivalent technologies of the claims, the present disclosure is also intended to encompass these modifications and variations.

What is claimed is:

1. An intelligent power module, comprising:
a substrate, wherein a chip and a plurality of conductive pins distributed in a peripheral side of the chip at intervals are arranged on the substrate, one end of each of the conductive pins is connected with the chip, and a solder pin is formed at an end portion of the other end of the each of the conductive pins;
an external pin frame, wherein the external pin frame comprises a plurality of leads corresponding to a plurality of solder pins one to one, and a connection structure configured to be connected with a corresponding solder pin is formed at an end portion of one end of each of the leads; and in each set of the connection structure and the solder pin that correspond to each other, the connection structure comprises: a connection portion arranged corresponding to a top surface of the solder pin, and two support portions located on two sides of the connection portion respectively and extending towards the substrate, wherein an arrangement direction of the two support portions is the same as an arrangement direction of the solder pins, an accommodation space is formed between the two support portions, and the solder pin is located between the two support portions; and
bonding materials, wherein the bonding materials are arranged on top surfaces of the solder pins, and are located between the solder pins and the connection portions, and the solder pins are connected with the connection portions by the bonding materials.

2. The intelligent power module as claimed in claim 1, wherein the two support portions of each of the connection structures have the same size in a direction perpendicular to the substrate.

3. The intelligent power module as claimed in claim 1, wherein in each of the connection structures, an end of each of the two support portions of the connection structure extending towards the substrate is in contact connection with the substrate.

4. The intelligent power module as claimed in claim 1, wherein in the each connection structure, a side of the connection portion facing a corresponding solder pin is provided with a boss structure.

5. The intelligent power module as claimed in claim 1, wherein the connection portion and the two support portions are of an integrated structure.

6. The intelligent power module as claimed in claim 1, wherein the substrate is a ceramic substrate.

7. The intelligent power module as claimed in claim 1, further comprising a printed circuit board (PCB), wherein the other end of each of the leads of the external pin frame is electrically connected with the PCB.

8. The intelligent power module as claimed in claim 1, wherein the bonding materials comprise solder paste, silver paste or sintered silver.

9. The intelligent power module as claimed in claim 1, wherein a material of the conductive pins comprises copper or aluminum.

10. A manufacturing method for an intelligent power module as claimed in claim 1, comprising:
    arranging the bonding materials on a top surface of each of solder pins of the substrate;
    assembling the external pin frame to the substrate by a carrier, wherein connection structures of leads of the external pin frame correspond to the solder pins one to one, and in the each set of the connection structure and the solder pin that correspond to each other, the connection portion of the connection structure corresponds to a top surface of the solder pin, the bonding materials are located between the connection portion and the solder pin, the two support portions of the connection structure are located on two sides of the solder pin respectively, and an arrangement direction of the two support portions is the same as an arrangement direction of the solder pins; and
    carrying out reflow soldering on the bonding materials to solder the connection portions with the solder pins.

11. The intelligent power module as claimed in claim 2, wherein in each of the connection structures, an end of each of the two support portions of the connection structure extending towards the substrate is in contact connection with the substrate.

12. The manufacturing method as claimed in claim 10, wherein the two support portions of each of the connection structures have the same size in a direction perpendicular to the substrate.

13. The manufacturing method as claimed in claim 10, wherein in each of the connection structures, an end of each of the two support portions of the connection structure extending towards the substrate is in contact connection with the substrate.

14. The manufacturing method as claimed in claim 10, wherein in the each connection structure, a side of the connection portion facing a corresponding solder pin is provided with a boss structure.

15. The manufacturing method as claimed in claim 10, the connection portion and the two support portions are of an integrated structure.

16. The manufacturing method as claimed in claim 10, wherein the substrate is a ceramic substrate.

17. The manufacturing method as claimed in claim 10, further comprising a printed circuit board (PCB), wherein the other end of each of the leads of the external pin frame is electrically connected with the PCB.

18. The manufacturing method as claimed in claim 10, wherein the bonding materials comprise solder paste, silver paste or sintered silver.

19. The manufacturing method as claimed in claim 10, wherein a material of the conductive pins comprises copper or aluminum.

* * * * *